US007161433B2

(12) United States Patent
Ueda et al.

(10) Patent No.: US 7,161,433 B2
(45) Date of Patent: Jan. 9, 2007

(54) HIGH-FREQUENCY AMPLIFIER

(75) Inventors: Hiroomi Ueda, Tokyo (JP); Shintaro Shinjo, Tokyo (JP); Noriharu Suematsu, Tokyo (JP); Kazutomi Mori, Tokyo (JP); Akira Inoue, Tokyo (JP); Akira Ohta, Tokyo (JP); Hiroaki Seki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 82 days.

(21) Appl. No.: 10/520,077

(22) PCT Filed: Jun. 11, 2003

(86) PCT No.: PCT/JP03/07426

§ 371 (c)(1),
(2), (4) Date: Jan. 5, 2005

(87) PCT Pub. No.: WO2004/112244

PCT Pub. Date: Dec. 23, 2004

(65) Prior Publication Data

US 2006/0152286 A1 Jul. 13, 2006

(51) Int. Cl.
H03F 3/68 (2006.01)
(52) U.S. Cl. ............................ 330/295; 330/307
(58) Field of Classification Search ............. 330/295, 330/310, 124 R, 307
See application file for complete search history.

(56) References Cited

U.S. PATENT DOCUMENTS 3,694,765 A 9/1972 Beurrier 5,903,854 A 5/1999 Abe et al.
6,473,595 B1 10/2002 Kim et al.
6,922,107 B1 * 7/2005 Green ....................... 330/296

FOREIGN PATENT DOCUMENTS

| JP | 5-110349 | 4/1993 |
| JP | 10-135750 | 5/1998 |
| JP | 2001-284984 | 10/2001 |
| JP | 2003-229728 | 8/2003 |

OTHER PUBLICATIONS

Shinato Shinjo, et al., "A 20mA Quiescent Current CV/CC Parallel Operation HBT Power Amplifier for W-CDMA Terminals", 2002 IEEE Radio Frequency Integrated Circuits Symposium, XP-002365196, Jun. 2, 2002, pp. 249-252.

* cited by examiner

Primary Examiner—Robert Pascal
Assistant Examiner—Hieu Nguyen
(74) Attorney, Agent, or Firm—Oblon, Spivak, McClelland, Maier & Neustadt, P.C.

(57) ABSTRACT

A high frequency amplifier includes a constant voltage driven amplifier 1 using as its amplifying element a bipolar transistor 7 with its base biased by a constant voltage, and a constant current driven amplifier 2 using as its amplifying element a bipolar transistor 8 with its base biased by a constant current. The idle current of the constant current driven amplifier 2 is set at a low value. In accordance with the idle current, the idle current of the constant voltage driven amplifier 1 is adjusted, and the two amplifiers are combined in parallel.

7 Claims, 6 Drawing Sheets

HIGH-FREQUENCY AMPLIFIER

CROSS REFERENCE TO RELATED APPLICATIONS

This application is a national stage application of parent application PCT/JP03/07426 filed on Jun. 11, 2003, the contents of which are incorporated herein by reference.

TECHNICAL FIELD

The present invention relates to a high frequency amplifier using bipolar transistors.

BACKGROUND ART

As for high frequency amplifiers used for digital mobile phones, low distortion characteristics are required to prevent interference with adjacent channels. Thus, the high frequency amplifiers improve the distortion characteristics by reducing the gain compression and the phase rotation of the transistors used for amplification.

The conventional high frequency amplifier achieves the low distortion characteristics by reducing the phase rotation and the gain compression of the amplifier circuit in its entirety by connecting a diode, FET, bipolar transistor and the like to a transistor serving as the amplifying element.

FIG. 1 is a block diagram showing a configuration of a conventional high frequency amplifier. This figure shows a two-stage high frequency amplifier disclosed in Japanese patent application laid-open No. 10-135750/1998 as an example of a conventional high frequency amplifier. In FIG. 1, the reference numeral 101 designates a pre-stage bipolar transistor, 102 designates a post-stage bipolar transistor, 103 designates an RF input terminal, 104 designates an input matching circuit of the bipolar transistor 101, 105 designates a constant current source, 106 designates a power supply voltage terminal, 107 designates an interstage matching circuit, 108 designates a constant voltage source, 109 designates an output matching circuit of the bipolar transistor 102, and 110 designates an RF output terminal.

Next, the operation will be described.

The pre-stage amplifier circuit is brought into operation with keeping the base current of the bipolar transistor 101, and the post-stage amplifier circuit is put into operation with keeping the base voltage of the bipolar transistor 102. The phase rotation of the signal amplified by the bipolar transistor 101 of the pre-stage amplifier circuit is canceled out by the phase rotation caused by the bipolar transistor 102 of the post-stage amplifier circuit. Thus, as for the amplified signal output from the high frequency amplifier, its phase rotation is suppressed so that its distortion characteristics are improved.

The two-stage configuration that combines the bipolar transistor 101 whose base current is kept constant with the bipolar transistor 102 whose base voltage is kept constant can improve the distortion characteristics without inserting a new element for distortion compensation, thereby being able to reduce the number of components.

The conventional high frequency amplifier with the foregoing configuration, however, has a problem of increasing the size of the high frequency amplifier. This is because it combines at least two stages: the amplifier circuit including the bipolar transistor whose base current is kept constant; and the amplifier circuit including the bipolar transistor whose base voltage is kept constant. In addition, to improve the distortion characteristics, it is necessary to increase the emitter size of the post-stage transistor, and to set the idle current (collector-base current when a DC voltage is applied) at a large value. This offers a problem of deteriorating the power added efficiency, particularly at a low output, and of reducing the power added efficiency even at a high output.

The present invention is implemented to solve the foregoing problems. Therefore it is an object of the present invention to provide a high frequency amplifier having good distortion characteristics and high power added efficiency at the high output, and having improved power added efficiency particularly at low output power.

Another object of the present invention is to provide a compact high frequency amplifier with improved distortion characteristics and power added efficiency.

DISCLOSURE OF THE INVENTION

According to one aspect of the present invention, there is provided a high frequency amplifier that parallelly combines a constant voltage driven amplifier section using an amplifying element biased by a constant voltage; and a constant current driven amplifier section using an amplifying element biased by a constant current.

Thus, it offers an advantage of being able to achieve good power added efficiency with keeping superior distortion characteristics.

The high frequency amplifier may have n amplifier sections including m constant current driven amplifier sections and (n−m) constant voltage driven amplifier sections that are parallelly combined, where n is an integer equal to or greater than two, and m is an integer equal to or greater than one and equal to or less than (n−1).

Thus, it offers an advantage of being able to achieve good power added efficiency with keeping superior distortion characteristics.

In the high frequency amplifier, each of the constant voltage driven amplifier sections may use a bipolar transistor as the amplifying element, and have its base biased by a constant voltage; and each of the constant current driven amplifier sections may use a bipolar transistor as the amplifying element, and have its base biased by a constant current.

Thus, it offers an advantage of being able to achieve good power added efficiency with keeping superior distortion characteristics.

In the high frequency amplifier, the constant voltage driven amplifier sections may comprise an input matching constant voltage bias circuit for carrying out input matching and for supplying a constant bias voltage to the amplifying elements, and an output matching power supply circuit for carrying out output matching and for supplying power to the amplifying elements; and the constant current driven amplifier sections may comprise an input matching constant current bias circuit for carrying out input matching and for supplying a constant bias current to the amplifying elements, and an output matching power supply circuit for carrying out output matching and for supplying power to the amplifying elements.

Thus, it offers an advantage of being able to reduce the number of components constituting the high frequency amplifier, and to implement downsizing.

The high frequency amplifier may further comprise an output matching power supply circuit for supplying power to the constant voltage driven amplifier sections and to the constant current driven amplifier sections, and for carrying out output matching of the constant voltage driven amplifier sections and of the constant current driven amplifier sections, wherein the constant voltage driven amplifier sections may comprise an input matching constant voltage bias circuit for carrying out input matching and for supplying a constant bias voltage to the amplifying elements, and the constant current driven amplifier sections may comprise an input matching constant current bias circuit for carrying out input matching and for supplying a constant bias current to the amplifying elements.

Thus, it offers an advantage of being able to reduce the number of components constituting the high frequency amplifier, and to implement downsizing.

The high frequency amplifier may further comprise an input matching circuit for carrying out input matching of the constant voltage driven amplifier sections and the constant current driven amplifier sections; and an output matching power supply circuit for supplying power to the constant voltage driven amplifier sections and the constant current driven amplifier sections, and for carrying out output matching of the constant voltage driven amplifier sections and the constant current driven amplifier sections, wherein the constant voltage driven amplifier sections may comprise a constant voltage bias circuit for supplying a constant bias voltage to the amplifying elements; and the constant current driven amplifier section may comprise a constant current bias circuit for supplying a constant bias current to the amplifying elements.

Thus, it offers an advantage of being able to reduce the number of components constituting the high frequency amplifier, and to implement downsizing.

In the high frequency amplifier, the amplifying elements may comprise a bipolar transistor whose base is biased by the constant voltage and a bipolar transistor whose base is biased by the constant current, the bipolar transistors being formed on a same chip with their bases separated; a collector lead-out pattern for connecting a collector of the bipolar transistor biased by the constant voltage and a collector of the bipolar transistor biased by the constant current to a single collector pad; an emitter lead-out pattern for connecting an emitter of the bipolar transistor biased by the constant voltage and an emitter of the bipolar transistor biased by the constant current to a single emitter pad; a base lead-out pattern for connecting a base of the bipolar transistor biased by the constant voltage to a base pad supplied with the constant bias voltage; and a base lead-out pattern for connecting a base of the bipolar transistor biased by the constant current to a base pad supplied with the constant bias current, wherein the base lead-out patterns and the emitter lead-out pattern are configured such that they have little or no overlapping section.

Thus, it offers an advantage of being able to parallelly combine the plurality of bipolar transistors formed on the same chip with keeping the good high frequency characteristics and with implementing the downsizing.

In the high frequency amplifier, each of the constant voltage driven amplifier sections may use an FET as the amplifying element, and have a gate of the FET biased by a constant voltage; and each of the constant current driven amplifier sections may use a bipolar transistor as the amplifying element, and have a base of the bipolar transistor biased by the constant current.

Thus, it offers an advantage of being able to achieve good power added efficiency with keeping superior distortion characteristics.

BEST MODE FOR CARRYING OUT THE INVENTION

The best mode for carrying out the invention will now be described with reference to the accompanying drawings to explain the present invention in more detail.

Embodiment 1

Figure 1:
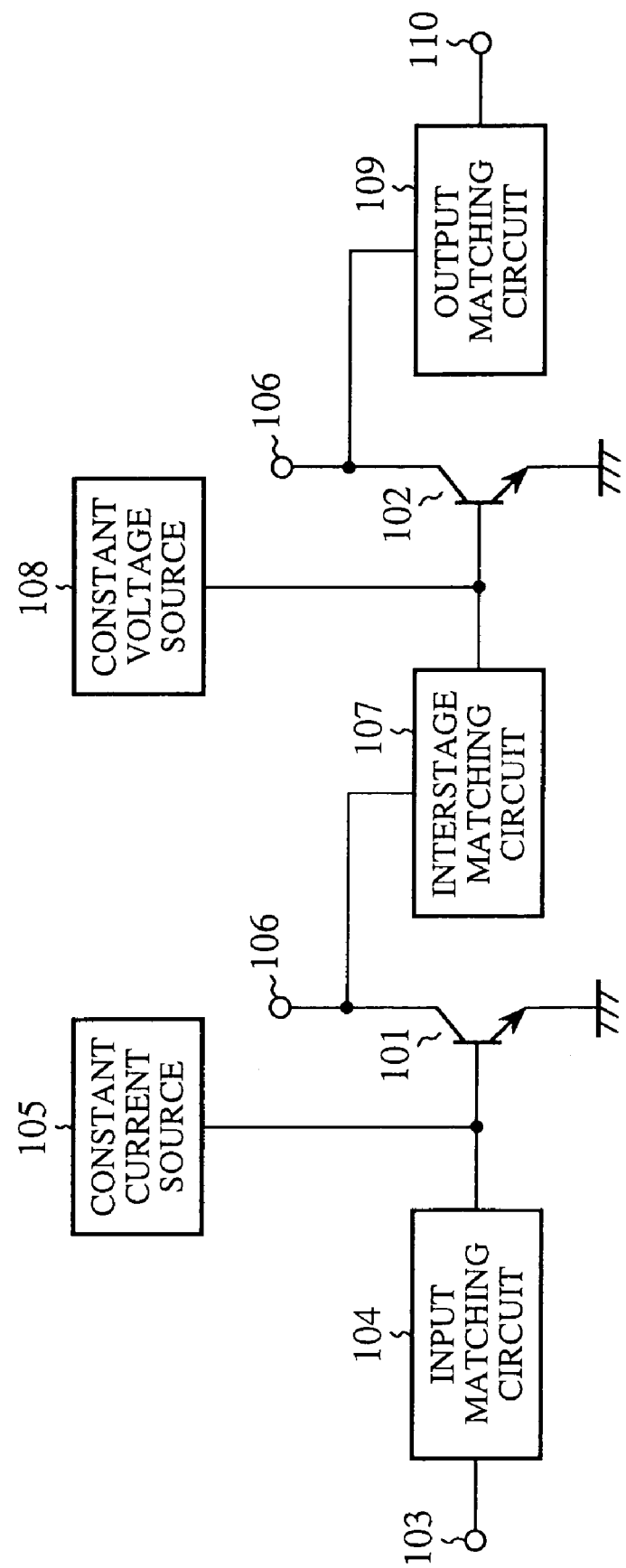
FIG. 1 is a block diagram showing a configuration of a conventional high frequency amplifier.
Figure 2A:
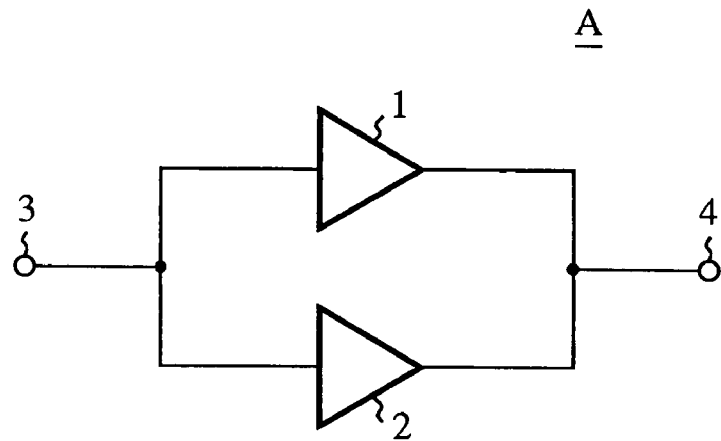
FIG. 2A is a circuit diagram showing a high frequency amplifier of an embodiment 1 in accordance with the present invention.
Figure 2B:
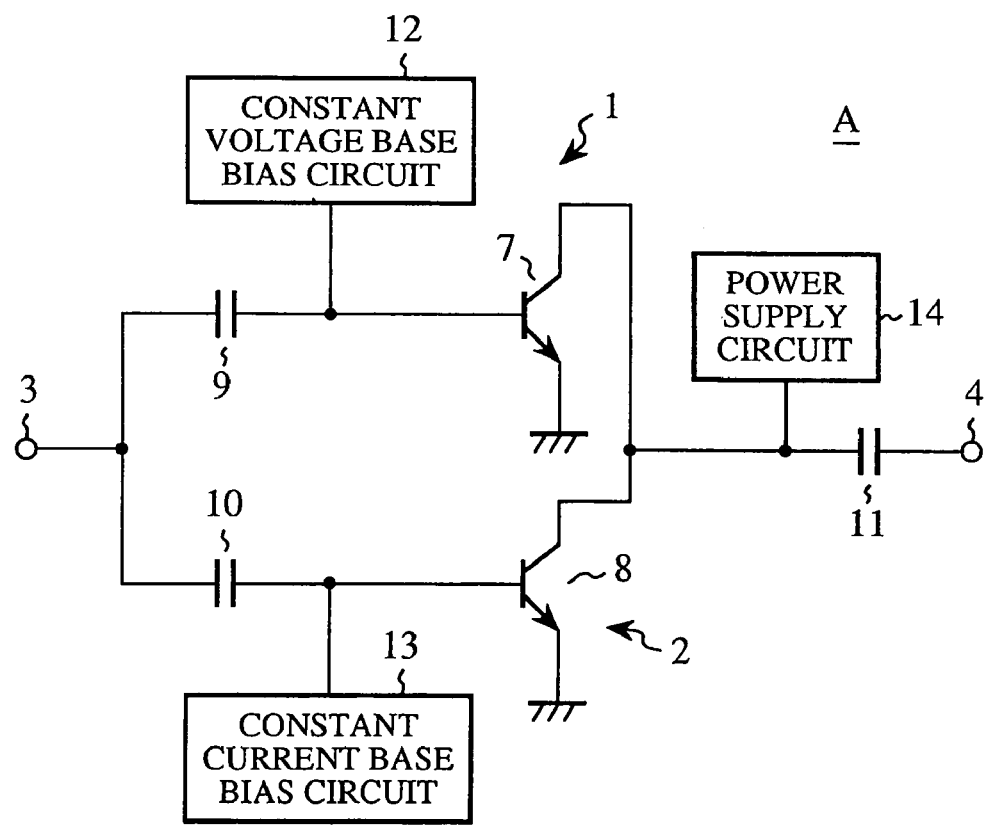
FIG. 2B is a diagram showing a concrete circuit configuration of the high frequency amplifier shown in FIG. 2A.

FIG. 2A is a circuit diagram showing a high frequency amplifier of an embodiment 1 in accordance with the present invention, and FIG. 2B is a diagram showing a concrete circuit configuration of the high frequency amplifier shown in FIG. 2A.

In these figures, the reference numeral 1 designates an amplifier (constant voltage driven amplifier section) including a bipolar transistor 7 serving as an amplifying element, and a bias circuit for driving the bipolar transistor 7 by supplying a constant voltage to its base. The reference numeral 2 designates an amplifier (constant current driven amplifier section) including a bipolar transistor 8 serving as an amplifying element, and a bias circuit for driving the bipolar transistor 8 by supplying a constant current to its base. The reference numeral 3 designates an RF input terminal, 4 designates an RF output terminal, and A designates a parallelly combined amplifier of the amplifier 1 and amplifier 2.

The reference numeral 7 designates the bipolar transistor serving as the amplifying element of the amplifier 1; 8 designates the bipolar transistor serving as the amplifying element of the amplifier 2; 9 designates a capacitive element connected to the base of the bipolar transistor 7; 10 designates a capacitive element connected to the base of the bipolar transistor 8; 11 designates a capacitive element for outputting the output power of the amplifiers 1 and 2 to the RF output terminal 4; 12 designates a constant voltage base bias circuit (constant voltage bias circuit); 13 designates a constant current base bias circuit (constant current bias circuit), and 14 designates a power supply circuit for supplying the power to the collectors of the bipolar transistors 7 and 8.

Here, at least the bipolar transistors 7 and 8 are formed on the same chip.

Figure 3:
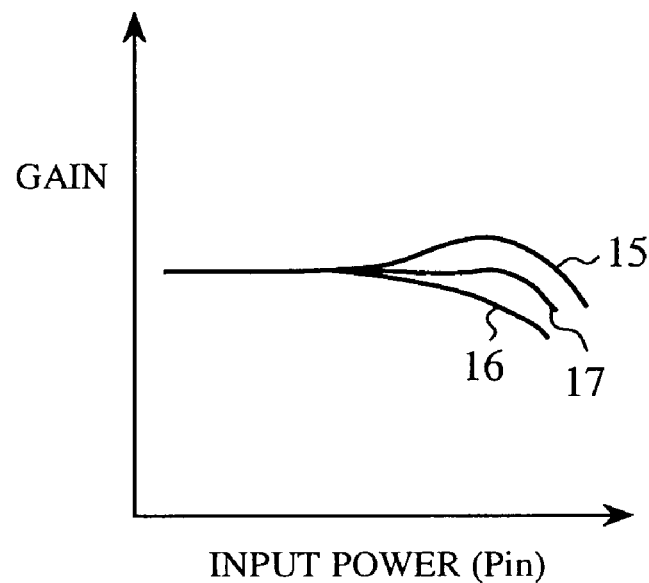
FIG. 3 is a graph illustrating gain characteristics of the high frequency amplifier of the embodiment 1 against input power.

FIG. 3 is a graph illustrating gain characteristics of the high frequency amplifier of the embodiment 1 against the input power. In FIG. 3, the reference numeral 15 designates a gain characteristic curve of the amplifier 1 with respect to the input power (Pin); 16 designates a gain characteristic curve with respect to the input power of the amplifier 2; and 17 designates a gain characteristic curve of the parallelly combined amplifier A of the amplifier 1 and amplifier 2 with respect to the input power.

Next, the operation will be described.

The amplifier 1 has the capacitive element 9 connected to the base of the bipolar transistor 7, and the amplifier 2 has the capacitive element 10 connected to the base of the bipolar transistor 8. Thus, the amplifier 1 and amplifier 2 can be set at different bias conditions, and the amplifier 1 carries out the amplification based on the constant voltage drive, whereas the amplifier 2 carries out the amplification based on the constant current drive.

The basic amplifying operation of the amplifier 1 will be described. The signal input to the RF input terminal 3 is supplied to the base of the bipolar transistor 7 via the capacitive element 9. In this case, the base of the bipolar transistor 7 is supplied with a constant base bias voltage from the constant voltage base bias circuit 12. In addition, the collector of the bipolar transistor 7 is fed with the power from the power supply circuit 14. The amplified signal is supplied to the RF output terminal 4 via the capacitive element 11. The emitter of the bipolar transistor 7 is grounded.

The basic amplifying operation of the amplifier 2 will be described. The signal input to the RF input terminal 3 is supplied to the base of the bipolar transistor 8 via the capacitive element 10. In this case, the base of the bipolar transistor 8 is supplied with a constant base bias current from the constant current base bias circuit 13. In addition, the collector of the bipolar transistor 8 is fed with the power from the power supply circuit 14. The amplified signal is supplied to the RF output terminal 4 via the capacitive element 11. The emitter of the bipolar transistor 8 is grounded.

The amplifier 1 exhibits the gain characteristics as indicated by the characteristic curve 15 in FIG. 3, when the constant bias voltage is fed to the base of the bipolar transistor 7, and the value of the idle current (the collector-base current when only the DC voltage is fed) is appropriately set. Specifically, the gain is constant in a range where the input signal has comparatively small amplitude, that is, where the input power is low. When the input power increases beyond that range, the gain increases with the input power in a certain range, and then reduces as the input power increases further.

The amplifier 2 exhibits the gain characteristic as indicated by the characteristic curve 16 in FIG. 3, when the constant bias current is fed to the base of the bipolar transistor 8 that amplifies the input power, and the value of the idle current is appropriately set. Specifically, the gain is constant in a range where the input power is low, and then reduces as the input power increases beyond that range.

The parallelly combined amplifier A of the amplifier 1 using the constant voltage base bias circuit 12 and the amplifier 2 using the constant current base bias circuit 13 of FIG. 2 exhibits the gain as indicated by the characteristic curve 17 of FIG. 3. The characteristic curve 17 indicates that the gain is flat up to a higher range of the input power than the ranges of the characteristic curves 15 and 16, and hence the distortion of the output signal is less. Thus, parallelly combining the amplifier 1, which is driven by the constant voltage supplied to the base of the bipolar transistor 7, with the amplifier 2, which is driven by the constant current supplied to the base of the bipolar transistor 8, such as the amplifier A, can implement a high frequency amplifier that can reduce the output distortion, achieve the flat gain for the input power in a wider range, and has superior distortion characteristics.

To achieve the input power-gain characteristics as indicated by the characteristic curve 17 in FIG. 3, the parallelly combined amplifier A of the amplifier 1 and amplifier 2 has the input power-gain characteristics of the amplifier 1 and the input power-gain characteristics of the amplifier 2 adjusted. This is performed by considering the matching between the saturated output power of the amplifier 1 and the saturated output power of the amplifier 2, and the distortion characteristics of the amplifier 1 and the distortion characteristics of the amplifier 2. More specifically, by adjusting the transistor sizes of the amplifying elements of the amplifiers, the ratio of the transistor sizes and the values of the idle currents of the individual amplifiers are optimized. Thus, the optimizations of the matching between the amplifiers 1 and 2 are carried out.

Figure 4:
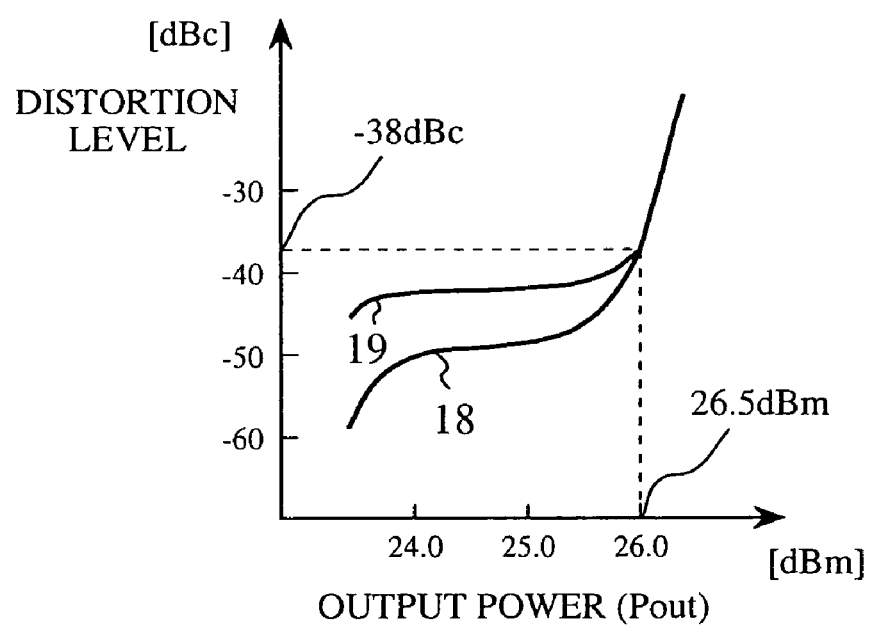
FIG. 4 is a graph illustrating distortion characteristics of the output power of the high frequency amplifier of the embodiment 1.
Figure 5:
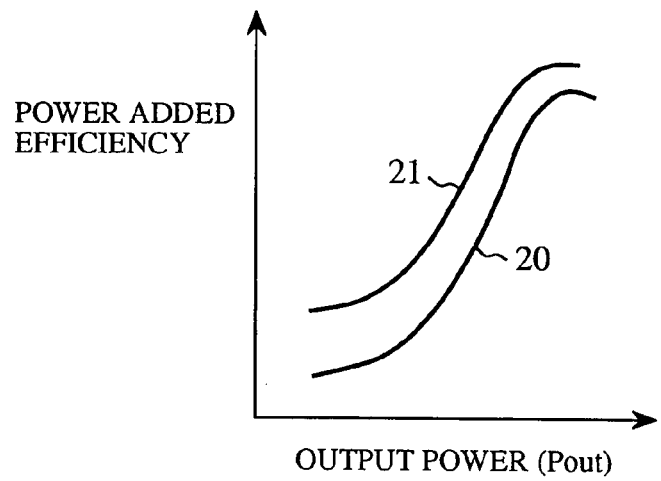
FIG. 5 is a graph illustrating the power added efficiency of the output power of the high frequency amplifier of the embodiment 1.

FIG. 4 is a graph illustrating distortion characteristics of the output power (Pout) of the high frequency amplifier of the embodiment 1. In FIG. 5, the reference numeral 18 designates a distortion characteristic curve of the output power (Pout) of the amplifier 1; and 19 designates a distortion characteristic curve of the output power of the parallelly combined amplifier A of the amplifier 1 and amplifier 2.

The standards of communication systems specify values of the distortion characteristics. For example, the standard of the W-CDMA specifies the m to satisfy the adjacent channel leakage power (ACPR)$\leqq$−38 dBc, when the output power (Pout)=26.5 dBm. The constant voltage driven amplifier 1 has the good distortion characteristics from the low output power as indicated by the distortion characteristic curve 18 of FIG. 4, which achieves the adjacent channel leakage power of −38 dBc at the output power of 26.5 dBm as illustrated in FIG. 4. In the low output power range, the adjacent channel leakage power is equal to or less than −50 dBc, which meets the standard that requires the value equal to or less than −38 dBc. The parallelly combined amplifier A of the amplifier 1 having the foregoing distortion characteristics and the constant current driven amplifier 2 has the distortion characteristics as indicated by the distortion characteristic curve 19.

The distortion characteristics indicated by the distortion characteristic curve 19 is achieved by adjusting the idle current of the amplifier 1 and the idle current of the amplifier 2. More specifically, the individual transistor sizes are determined such that the emitter area AE1 of the bipolar transistor 7 of the amplifier 1 is made greater than the emitter area AE2 of the bipolar transistor 8 of the amplifier 2 (AE1>AE2). In addition, the circuit is configured such that the base bias voltage Vbe1 of the bipolar transistor 7 is greater than the base bias voltage Vbe2 of the bipolar transistor 8 (Vbe1>Vbe2). This makes good distortion characteristics possible that enable the adjacent channel leakage power to be set at about −40 dBc in the low output power range, and to be set at −38 dBc when the output power is 26.5 dBm.

The parallelly combined amplifier A of the amplifiers 1 and 2 has the good distortion characteristics as described above, when the idle current of the constant current driven amplifier 2 is adjusted at a low value and the idle current of the constant voltage driven amplifier 1 is adjusted in accordance with the low idle current. Combining the constant current driven amplifier 2 whose idle current is set at the low value with the constant voltage driven amplifier 1 in parallel can implement the high frequency amplifier with good power added efficiency while keeping the superior distortion characteristics.

Next, the power added efficiency of the high frequency amplifier of the embodiment 1 will be described.

FIG. 5 is a graph illustrating the power added efficiency of the output power (Pout) of the high frequency amplifier of the embodiment 1. In FIG. 5, the reference numeral 20 designates a characteristic curve indicating the power added efficiency of the output of the amplifier 1; and 21 designates a characteristic curve indicating the power added efficiency of the output of the amplifier A.

The power added efficiency indicated by the characteristic curve 21 of FIG. 5 is obtained by the optimization carried out by setting the idle current of the constant current driven amplifier 2 constituting the amplifier A at a low value, and by adjusting the idle current of the constant voltage driven amplifier 1 in accordance with the idle current of the amplifier 2. Comparing the characteristic curve 21 with the characteristic curve 20 of FIG. 5 shows that the added characteristic of the amplifier A is better than that of the amplifier 1 at any output power levels. In particular, the power added efficiency of the amplifier A is better than that of the amplifier 1 in the range in which the output power is low or saturated. Thus, the power added efficiency can be improved without deteriorating the distortion characteristics to such a level that can bring about a fault, by parallelly combining the two amplifiers, by setting the idle current of the constant current driven amplifier 2 at a low value, and by setting the idle current of the constant voltage driven amplifier 1 in accordance with the idle current of the amplifier 2.

As described above, since the present embodiment 1 parallelly combines the constant voltage driven amplifier 1 with the constant current driven amplifier 2, it can maintain the gain up to the high input power range, offering an advantage of being able to achieve the good distortion characteristics.

In addition, since the present embodiment 1 is configured such that the idle current of the constant current driven amplifier 2 is set at a low value, and the idle current of the constant voltage driven amplifier 1 is adjusted in accordance with the idle current of the amplifier 2, it can achieve the good distortion characteristics. In particular, it offers an advantage of being able to achieve the good power added efficiency in the low output power and saturated output power ranges.

Embodiment 2

Figure 6:
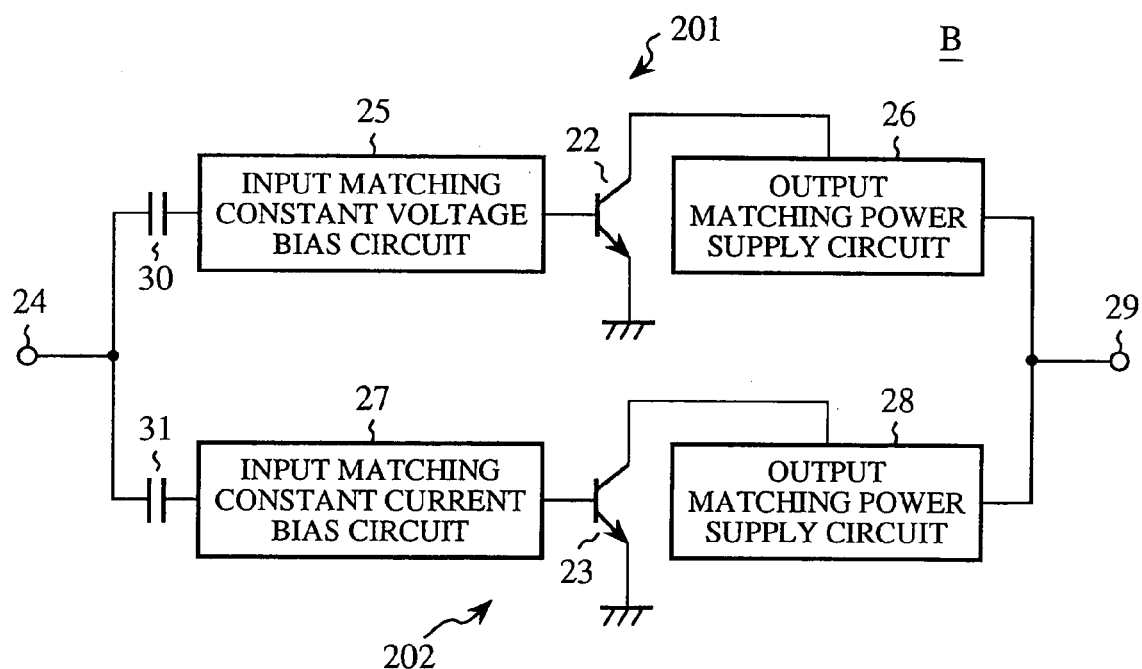
FIG. 6 is a circuit diagram showing a high frequency amplifier of an embodiment 2 in accordance with the present invention.

FIG. 6 is a circuit diagram showing a high frequency amplifier of an embodiment 2 in accordance with the present invention. In FIG. 6, the reference numeral 22 designates a bipolar transistor of an amplifying element driven by a constant voltage fed to the base; 23 designates a bipolar transistor of an amplifying element driven by a constant current fed to the base; 24 designates an RF input terminal, 25 designates an input matching constant voltage bias circuit including an input matching circuit and a constant voltage base bias circuit as its integral parts; 26 designates an output matching power supply circuit including an output matching circuit and a power supply circuit as its integral parts; 27 designates an input matching constant current bias circuit including an input matching circuit and a constant current base bias circuit as its integral parts; 28 designates an output matching power supply circuit including an output matching circuit and a power supply circuit as its integral parts; 29 designates an RF output terminal, 30 designates a capacitive element connected to the base of the bipolar transistor 22; 31 designates a capacitive element connected to the base of the bipolar transistor 23; 201 designates an amplifier (constant voltage driven amplifier section) including the bipolar transistor 22 serving as an amplifying element, the capacitive element 30, the input matching constant voltage bias circuit 25 and the output matching power supply circuit 26; 202 designates an amplifier (constant current driven amplifier section) including the bipolar transistor 23 serving as the amplifying element, the capacitive element 31, the input matching constant current bias circuit 27 and the output matching power supply circuit 28; and B designates a parallelly combined amplifier of the amplifier 201 and the amplifier 202.

Next, the operation will be described.

The high frequency amplifier of the embodiment 2 has the input matching constant voltage bias circuit 25 and the output matching power supply circuit 26 in the constant voltage driven amplifier 201, and has the input matching constant current bias circuit 27 and the output matching power supply circuit 28 in the constant current driven amplifier 202. The bipolar transistor 22 corresponds to the bipolar transistor 7 of FIG. 2, the bipolar transistor 23 corresponds to the bipolar transistor 8 of FIG. 2, the capacitive element 30 corresponds to the capacitive element 9 of FIG. 2, and the capacitive element 31 corresponds to the capacitive element 10 of FIG. 2. They each offer the same effective and advantages.

The amplifiers 201 and 202 of the embodiment 2 carry out the operations corresponding to those of the amplifiers 1 and 2 of the embodiment 1. Thus, the emitter areas of the bipolar transistors of the amplifying elements and the idle current values set by the Vbe voltages can be handled in the same manner as described in the foregoing embodiment 1. In addition, the high frequency amplification operates in the same manner, and the distortion characteristics of the output power and the power added efficiency can be handled in the same way. As described above, the parallelly combined amplifier B of the amplifier 201 and amplifier 202 of the embodiment 2 operates in the same manner as the parallelly combined amplifier A of the amplifier 1 and amplifier 2 of the embodiment 1, and offers the same advantages. Accordingly, their description is omitted here, and only the operation characteristic to the amplifiers 201 and 202 of the embodiment 2 will be described.

The amplifier 201 carries out matching of the signal input via the RF input terminal 24 using the input matching constant voltage bias circuit 25, and supplies it to the base of the bipolar transistor 22 via the capacitive element 30. In this case, the base of the bipolar transistor 22 is supplied with a constant base bias voltage from the input matching constant voltage bias circuit 25. In addition, the collector of the bipolar transistor 22 is supplied with the power from the output matching power supply circuit 26. The signal amplified by the bipolar transistor 22 is subjected to the output matching by the output matching power supply circuit 26, and is supplied to the RF output terminal 29 in conjunction with the signal output from the output matching power supply circuit 28. The emitter of the bipolar transistor 22 is grounded.

The amplifier 202 carries out matching of the signal input via the RF input terminal 24 using the input matching constant current bias circuit 27, and supplies it to the base of the bipolar transistor 23 via the capacitive element 31. In this case, the base of the bipolar transistor 23 is supplied with a constant base bias current from the input matching constant current bias circuit 27. In addition, the collector of the bipolar transistor 23 is supplied with the power from the output matching power supply circuit 28. The signal amplified by the bipolar transistor 23 is subjected to the output matching by the output matching power supply circuit 28, and is supplied to the RF output terminal 29 in conjunction with the output power fed from the output matching power supply circuit 26. The emitter of the bipolar transistor 23 is grounded.

As described above, according to the present embodiment 2, the amplifier 201 has the input matching constant voltage bias circuit 25 including the input matching circuit and the constant voltage base bias circuit as its integral parts, and has the output matching power supply circuit 26 including the output matching circuit and the power supply circuit as its integral parts; and the amplifier 202 has the input matching constant current bias circuit 27 including the input matching circuit and the constant current base bias circuit as its integral parts, and has the output matching power supply circuit 28 including the output matching circuit and the power supply circuit as its integral parts. Consequently, the present embodiment 2 can reduce the number of the components constituting the high frequency amplifier, and offers an advantage of being able to achieve the downsizing of the high frequency amplifier.

In addition, since the present embodiment 2 parallelly combines the constant voltage driven amplifier 201 with the constant current driven amplifier 202, it can maintain the gain up to the high input power range, offering an advantage of being able to achieve the good distortion characteristics.

Furthermore, since the present embodiment 2 is configured such that the idle current of the constant current driven amplifier 202 is set at a low value, and the idle current of the constant voltage driven amplifier 201 is adjusted in accordance with the idle current of the amplifier 202, it can achieve the good distortion characteristics. In particular, it offers an advantage of being able to achieve the good power added efficiency in the low output power and saturated output power ranges.

Embodiment 3

Figure 7:
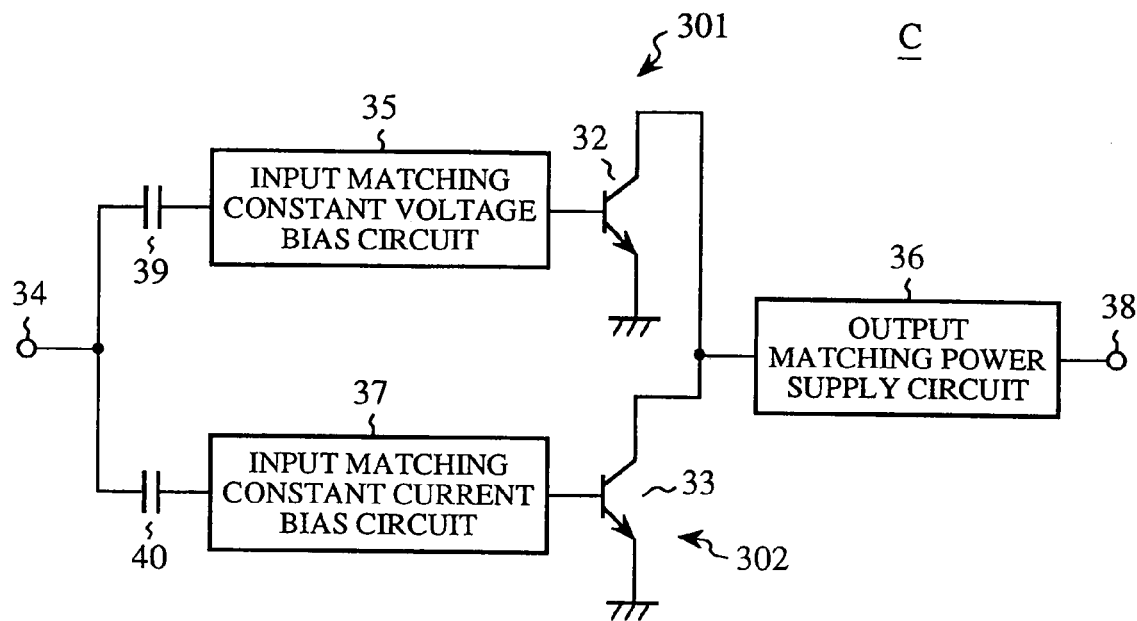
FIG. 7 is a circuit diagram showing a high frequency amplifier of an embodiment 3 in accordance with the present invention.

FIG. 7 is a circuit diagram showing a high frequency amplifier of an embodiment 3 in accordance with the present invention. In FIG. 7, the reference numeral 32 designates a bipolar transistor of an amplifying element driven by a constant voltage fed to the base; 33 designates a bipolar transistor of an amplifying element driven by a constant current fed to the base; 34 designates an RF input terminal, 35 designates an input matching constant voltage bias circuit including an input matching circuit and a constant voltage base bias circuit as its integral parts; 36 designates an output matching power supply circuit including an output matching circuit and a power supply circuit as its integral parts; 37 designates an input matching constant current bias circuit including an input matching circuit and a constant current base bias circuit as its integral parts; 38 designates an RF output terminal, 39 designates a capacitive element connected to the base of the bipolar transistor 32; 40 designates a capacitive element connected to the base of the bipolar transistor 33; 301 designates an amplifier (constant voltage driven amplifier section) that carries out amplification using the bipolar transistor 32; 302 designates an amplifier (constant current driven amplifier section) that carries out amplification using the bipolar transistor; and C designates a parallelly combined amplifier of the amplifier 301 and the amplifier 302.

Next, the operation will be described.

The high frequency amplifier of the embodiment 3 has the input matching constant voltage bias circuit 35 in the constant voltage driven amplifier 301, and has the input matching constant current bias circuit 37 in the constant current driven amplifier 302. In addition, the parallelly combined amplifier C of the amplifiers 301 and 302 has the output matching power supply circuit 36 that carries out matching of the outputs of the amplifiers 301 and 302, and supplies the power. The bipolar transistor 32 of the amplifier 301 corresponds to the bipolar transistor 7 of FIG. 2, the bipolar transistor 33 of the amplifier 302 corresponds to the bipolar transistor 8 of FIG. 2, the capacitive element 39 corresponds to the capacitive element 9 of FIG. 2, and the capacitive element 40 corresponds to the capacitive element 10 of FIG. 2. They each offer the same effective and advantages.

The amplifiers 301 and 302 of the embodiment 3 carry out the operations corresponding to those of the amplifiers 1 and 2 of the embodiment 1. Thus, the emitter areas of the bipolar transistors of the amplifying elements and the idle current values set by the Vbe voltages can be handled in the same manner as described in the foregoing embodiment 1. In addition, the high frequency amplification operates in the same manner, and the distortion characteristics of the output power and the power added efficiency can be handled in the same way. Thus, the parallelly combined amplifier C of the amplifiers 301 and 302 of the embodiment 3 operates in the same manner as the parallelly combined amplifier A of the amplifiers 1 and 2 of the embodiment 1, and offers the same advantages. Accordingly, their description is omitted here, and only the operation characteristic to the amplifiers 301 and 302 of the embodiment 3 will be described.

The amplifier 301 carries out matching of the signal input via the RF input terminal 34 using the input matching constant voltage bias circuit 35, and supplies it to the base of the bipolar transistor 32 via the capacitive element 29. In this case, the base of the bipolar transistor 32 is supplied with a constant base bias voltage from the input matching constant voltage bias circuit 35. In addition, the collector of the bipolar transistor 32 is supplied with the power from the output matching power supply circuit 36. The signal amplified by the bipolar transistor 32 is subjected to the matching in conjunction with the output signal of the bipolar transistor 33 by the output matching power supply circuit 36, and is supplied to the RF output terminal 38. The emitter of the bipolar transistor 32 is grounded.

The amplifier 302 carries out matching of the signal input via the RF input terminal 34 using the input matching constant current bias circuit 37, and supplies it to the base of the bipolar transistor 33 via the capacitive element 40. In this case, the base of the bipolar transistor 33 is supplied with a constant base bias current from the input matching constant current bias circuit 37. In addition, the collector of the bipolar transistor 33 is supplied with the power from the output matching power supply circuit 36. The signal amplified by the bipolar transistor 33 is subjected to the matching in conjunction with the output signal of the bipolar transistor 32 by the output matching power supply circuit 36, and is supplied to the RF output terminal 38. The emitter of the bipolar transistor 33 is grounded.

As described above, the present embodiment 3 has in the constant voltage driven amplifier 301 the input matching constant voltage bias circuit 35 including the input matching circuit and the constant voltage base bias circuit as its integral parts; has in the constant current driven amplifier 302 the input matching constant current bias circuit 37 including the input matching circuit and the constant current base bias circuit as its integral parts; and has the output matching power supply circuit 36 including the output matching circuit for matching the output powers of the amplifiers 301 and 302 and the power supply circuit for supplying power to the amplifiers 301 and 302 as its integral parts. Consequently, the present embodiment 3 can reduce the number of the components constituting the high frequency amplifier, and offers an advantage of being able to achieve the downsizing of the high frequency amplifier.

In addition, since the present embodiment 3 parallelly combines the constant voltage driven amplifier 301 with the constant current driven amplifier 302, it can maintain the gain up to the high input power range, offering an advantage of being able to achieve the good distortion characteristics.

Furthermore, since the present embodiment 3 is configured such that the idle current of the constant current driven amplifier 302 is set at a low value, and the idle current of the constant voltage driven amplifier 301 is adjusted in accordance with the idle current of the amplifier 302, it can achieve the good distortion characteristics. In particular, it offers an advantage of being able to achieve the good power added efficiency in the low output power and saturated output power ranges.

Embodiment 4

Figure 8:
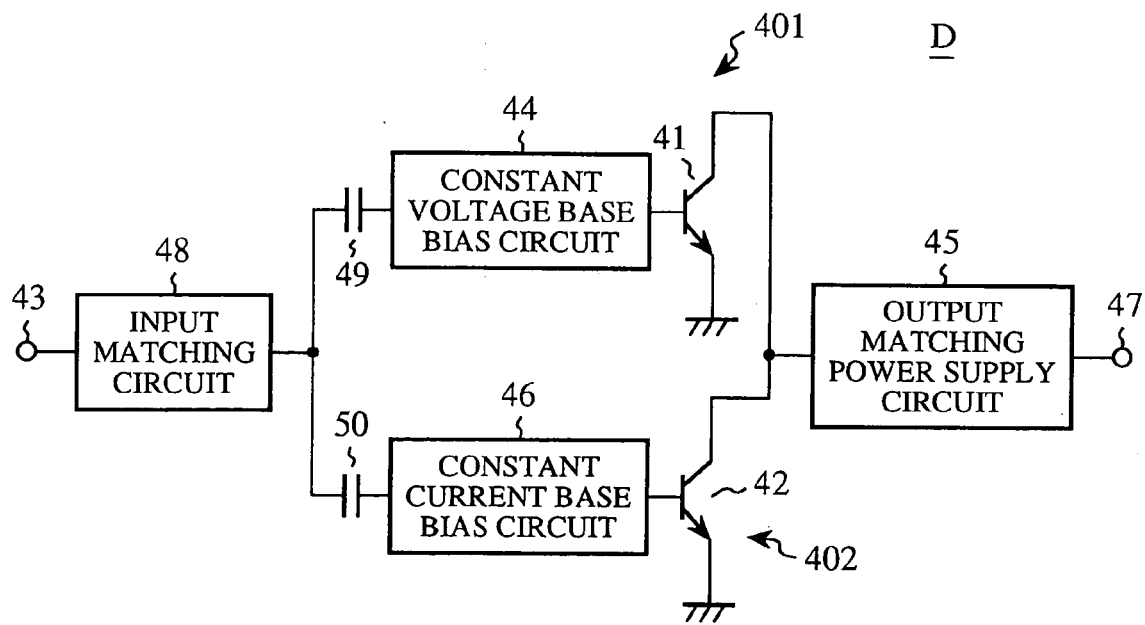
FIG. 8 is a circuit diagram showing a high frequency amplifier of an embodiment 4 in accordance with the present invention.

FIG. 8 is a circuit diagram showing a high frequency amplifier of an embodiment 4 in accordance with the present invention. In FIG. 8, the reference numeral 41 designates a bipolar transistor of an amplifying element driven by a constant voltage fed to the base; 42 designates a bipolar transistor of an amplifying element driven by a constant current fed to the base; 43 designates an RF input terminal; 44 designates a constant voltage base bias circuit (constant voltage bias circuit); 45 designates an output matching power supply circuit including an output matching circuit and a power supply circuit as its integral parts; 46 designates a constant current base bias circuit (constant current bias circuit); 47 designates an RF output terminal; 48 designates an input matching circuit; 49 designates a capacitive element connected to the base of the bipolar transistor 41; 50 designates a capacitive element connected to the base of the bipolar transistor 42; 401 designates an amplifier (constant voltage driven amplifier section) that carries out amplification using the bipolar transistor 41; 402 designates an amplifier (constant current driven amplifier section) that carries out amplification using the bipolar transistor 42; and D designates a parallelly combined amplifier of the amplifier 401 and the amplifier 402.

Next, the operation will be described.

The high frequency amplifier of the embodiment has the constant voltage base bias circuit 44 in the constant voltage driven amplifier 401, and the constant current base bias circuit 46 in the constant current driven amplifier 402. In addition, the parallelly combined amplifier D of the amplifiers 401 and 402 has the input matching circuit 48 that carries out matching of the signal input to the amplifiers 401 and 402, and the output matching power supply circuit 45 that carries out matching of the output signals of the amplifiers 401 and 402, and supplies the signal to the RF output terminal 47. The bipolar transistor 41 of the amplifier 401 corresponds to the bipolar transistor 7 of FIG. 2, the bipolar transistor 42 of the amplifier 402 corresponds to the bipolar transistor 8 of FIG. 2, the capacitive element 49 corresponds to the capacitive element 9 of FIG. 2, and the capacitive element 50 corresponds to the capacitive element 10 of FIG. 2. They each offer the same effective and advantages.

The amplifiers 401 and 402 of the embodiment 4 carry out the operations corresponding to the operations of the amplifiers 1 and 2 of the embodiment 1. Thus, the idle current values set by adjusting the emitter areas of the bipolar transistors of the amplifying elements and the Vbe voltages can be handled in the same manner as described in the foregoing embodiment 1. In addition, the high frequency amplification operates in the same manner, and the distortion characteristics of the output power and the power added efficiency can be handled in the same way. Thus, the parallelly combined amplifier D of the amplifiers 401 and 402 of the embodiment 4 operates in the same manner as the parallelly combined amplifier A of the amplifiers 1 and 2 of the embodiment 1, and offers the same effect and advantages. Accordingly, their description is omitted here, and only the operation characteristic to the amplifiers 401 and 402 of the embodiment 4 will be described.

The amplifier 401 constituting the amplifier D biases the signal, which is input via the RF input terminal 43 and undergoes the matching by the input matching circuit 48, at the constant voltage using the constant voltage base bias circuit 44, and supplies it to the base of the bipolar transistor 41 via the capacitive element 49. In this case, the collector of the bipolar transistor 41 is supplied with the power from the output matching power supply circuit 45. The signal amplified by the bipolar transistor 41 is subjected to the matching in conjunction with the output signal of the bipolar transistor 42 by the output matching power supply circuit 45, and is supplied to the RF output terminal 47. The emitter of the bipolar transistor 41 is grounded.

The amplifier 402 constituting the amplifier D biases the signal, which is input via the RF input terminal 43 and undergoes the matching by the input matching circuit 48, at the constant current using the constant current base bias circuit 46, and supplies it to the base of the bipolar transistor 42 via the capacitive element 50. In this case, the collector of the bipolar transistor 42 is supplied with the power from the output matching power supply circuit 45. The signal amplified by the bipolar transistor 42 is subjected to the matching in conjunction with the output signal of the bipolar transistor 41 by the output matching power supply circuit 45, and is supplied to the RF output terminal 47. The emitter of the bipolar transistor 42 is grounded.

As described above, according to the present embodiment 4, the parallelly combined amplifier D of the constant voltage driven amplifier 401 and the constant current driven amplifier 402 has the input matching circuit 48 that carries out matching of the input signal and supplies it to the amplifiers 401 and 402, and the output matching power supply circuit 45 that supplies power to the amplifiers 401 and 402, and carries out matching of the output signals of the amplifiers 401 and 402. As a result, the present embodiment 4 can reduce the number of the components constituting the high frequency amplifier, and offers an advantage of being able to achieve the downsizing of the high frequency amplifier.

In addition, since the present embodiment 4 parallelly combines the constant voltage driven amplifier 401 with the constant current driven amplifier 402, it can maintain the gain up to the high input power range, offering an advantage of being able to achieve the good distortion characteristics.

Furthermore, since the present embodiment 4 is configured such that the idle current of the constant current driven amplifier 402 is set at a low value, and the idle current of the constant voltage driven amplifier 401 is adjusted in accordance with the idle current of the amplifier 402, it can achieve the good distortion characteristics. In particular, it offers an advantage of being able to achieve the good power added efficiency in the low output power and saturated output power ranges.

Embodiment 5

Figure 9:
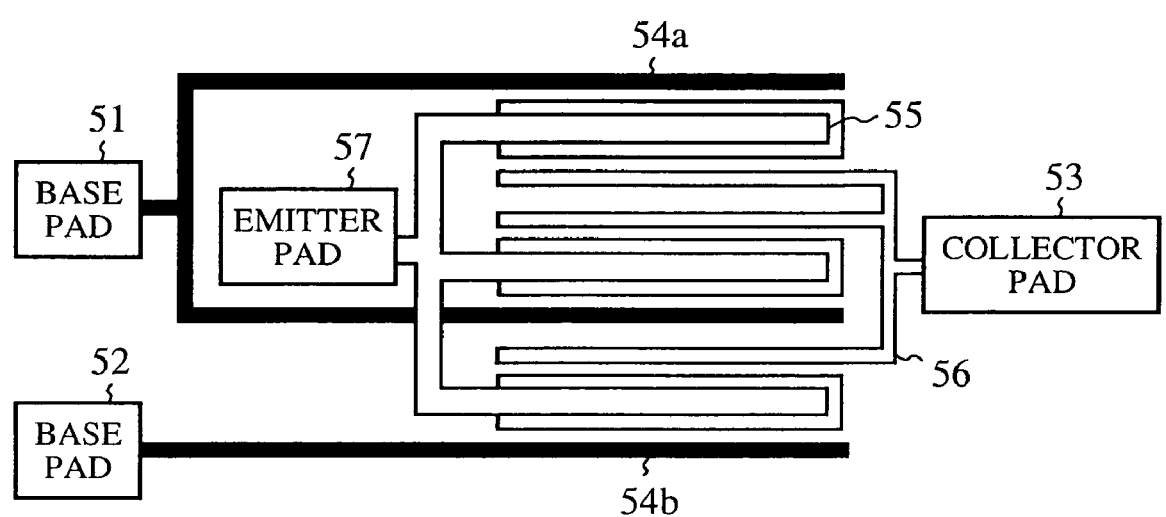
FIG. 9 is a diagram illustrating a configuration of a parallelly combined bipolar transistor used for a high frequency amplifier of an embodiment 5 in accordance with the present invention.

FIG. 9 is a diagram illustrating a configuration of a parallelly combined bipolar transistor used for a high frequency amplifier of an embodiment 5 in accordance with the present invention. The bipolar transistor shown in FIG. 9 has a plurality of bipolar transistors formed on the same chip. The bipolar transistors on the chip are divided into a group whose bases are subjected to the constant voltage drive and a group whose bases are subjected to the constant current drive. In FIG. 9, the reference numeral 51 designates a base pad of a constant voltage driven bipolar transistor; 52 designates a base pad of a constant current driven bipolar transistor; 53 designates a collector pad for parallelly combining the collectors of the individual bipolar transistors; 54a designates a base lead-out pattern for connecting the base of the constant voltage driven bipolar transistor to the base pad 51; 54b designates a base lead-out pattern for connecting the base of the constant current driven bipolar transistor to the base pad 52; 55 designates an emitter lead-out pattern; 56 designates a collector lead-out pattern; and 57 designates an emitter pad for parallelly combining the emitters of the individual bipolar transistors.

The structure shown in FIG. 9 has an emitter area ratio of 2:1 between the constant voltage driven bipolar transistor and the constant current driven bipolar transistor, for example. These bipolar transistors are combined by connecting the collector of the constant voltage driven bipolar transistor and that of the constant current driven bipolar transistor to the single collector pad 53 using the collector lead-out pattern 56, and by connecting the emitter of the constant voltage driven bipolar transistor and that of the constant current driven bipolar transistor to the single emitter pad 57 using the emitter lead-out pattern 55. The emitters of the bipolar transistors are grounded through a via hole (through hole not shown) formed on the emitter pad 57.

The base of the constant voltage driven bipolar transistor is connected to the base pad 51 by the base lead-out pattern 54a pulled out of a portion constituting the base. Likewise, the base of the constant current driven bipolar transistor is connected to the base pad 52 by the base lead-out pattern 54b pulled out of a portion constituting the base. It is preferable that the base lead-out patterns 54a and 54b and the emitter lead-out pattern 55 do not overlap and are separated as far as possible, to achieve high frequency characteristics.

With such a configuration, when the base pad 51 is supplied with a constant bias voltage, and the base pad 52 is supplied with the constant bias current, the base of the constant voltage driven bipolar transistor is biased by the constant voltage, and the base of the constant current driven bipolar transistor is biased by the constant current.

Incidentally, as for the configuration in which the constant voltage driven amplifier and the constant current driven amplifier are supplied with power from different power supply circuits as in the high frequency amplifier of the embodiment 2, the collectors of the individual bipolar transistors are connected to collector pads separated apart from each other.

The parallelly combined transistor of the constant voltage driven bipolar transistor and the constant current driven bipolar transistor as described in the present embodiment 5 is also applicable to the high frequency amplifiers described in the foregoing embodiments 1–4.

As described above, the present embodiment 5 is configured such that the plurality of bipolar transistors are formed on the same chip, and the base supplied with the constant voltage is formed separately from the base supplied with the constant current, that the plurality of collectors are connected to the single collector pad 53 using the collector lead-out pattern 56, and the plurality of emitters are connected to the single emitter pad 57 using the emitter lead-out pattern 55, and that the base of the constant voltage driven bipolar transistor is connected to the base pad 51 supplied with the constant voltage via the base lead-out pattern 54a, and the base of the constant current driven bipolar transistor is connected to the base pad 52 supplied with the constant current via the base lead-out pattern 54b. Thus, the present embodiment 5 offers an advantage of being able to form the parallelly combined bipolar transistors on the same chip with reducing the size.

Embodiment 6

Next, the high frequency amplifier of an embodiment 6 in accordance with the present invention will be described. The high frequency amplifier of the embodiment 6 has the same configuration as anyone of the configurations of the embodiments 1–4 except that the constant voltage driven amplifier of the high frequency amplifier uses an FET instead of the bipolar transistor as the amplifying element. Supplying the gate of the FET with the constant bias voltage can carry out the same amplifying operation as the high frequency amplifier using the bipolar transistor, thereby being able to achieve the same effect and advantages.

Although the embodiments 1–4 are described by way of example of the high frequency amplifiers using the bipolar transistor as the amplifying element, this is not essential. Using a SiBJT, SiGeBJT, or HBT (Heterojunction Bipolar Transistor) composed of a compound such as InGaP as the amplifying element can achieve the same effect and advantages.

Although the foregoing embodiments are described by way of example of the parallelly combined transistor of the single bipolar transistor driven by the constant voltage base bias and the single bipolar transistor driven by the constant current base bias, the high frequency amplifier in accordance with the present invention is not limited to the configuration. For example, a configuration is also possible in which the high frequency amplifier includes n amplifiers (amplifier sections), where n is an integer equal to or greater than two, wherein m constant current driven amplifiers are parallelly combined with equal to or greater than one and equal to or less than (n−1). The configuration can achieve the same effect and advantages.

As described above, according to the present embodiment 6, the constant voltage driven amplifier, which is configured by using the FET as the amplifying element, is parallelly combined with the constant current driven amplifier. Thus, the embodiment 6 offers an advantage of being able to achieve good power added efficiency with keeping the superior distortion characteristics.

The present invention has been described in detail with respect to preferred embodiments, and it will now be apparent from the foregoing to those skilled in the art that changes and modifications in the form and details may be made without departing from the invention in its broader aspect, and it is the intention, therefore, in the apparent claims to cover all such changes and modifications as fall within the true spirit of the invention

INDUSTRIAL APPLICABILITY

As described above, the high frequency amplifier in accordance with the present invention is suitable to implement the high power added efficiency with keeping the good distortion characteristics at the high output, and to improve the power added efficiency at the low output power.

What is claimed is:

1. A high frequency amplifier for amplifying a high frequency signal using a plurality of amplifier sections, said high frequency amplifier comprising:
   a constant voltage driven amplifier section using an amplifying element biased by a constant voltage; and
   a constant current driven amplifier section using an amplifying element biased by a constant current, wherein
   said constant voltage driven amplifier section and said constant current driven amplifier section are parallelly combined, wherein
   the amplifying elements comprise a bipolar transistor whose base is biased by the constant voltage and a bipolar transistor whose base is biased by the constant current, the bipolar transistors being formed on a same chip with their bases separated;
   a collector lead-out pattern for connecting a collector of said bipolar transistor biased by the constant voltage and a collector of said bipolar transistor biased by the constant current to a single collector pad;
   an emitter lead-out pattern for connecting an emitter of said bipolar transistor biased by the constant voltage and an emitter of said bipolar transistor biased by the constant current to a single emitter pad;
   a base lead-out pattern for connecting a base of said bipolar transistor biased by the constant voltage to a base pad supplied with the constant bias voltage; and
   a base lead-out pattern for connecting a base of said bipolar transistor biased by the constant current to a base pad supplied with the constant bias current, wherein
   said base lead-out patterns and said emitter lead-out pattern are configured such that they have little or no overlapping section.

2. The high frequency amplifier according to claim 1, wherein said high frequency amplifier has n amplifier sections including m constant current driven amplifier sections and (n−m) constant voltage driven amplifier sections that are parallelly combined, where n is an integer equal to or greater than two, and m is an integer equal to or greater than one and equal to or less than (n−1).

3. The high frequency amplifier according to claim 2, wherein
   each of said constant voltage driven amplifier sections uses a bipolar transistor as the amplifying element, and has its base biased by a constant voltage; and
   each of said constant current driven amplifier sections uses a bipolar transistor as the amplifying element, and has its base biased by a constant current.

4. The high frequency amplifier according to claim 2, wherein
   said constant voltage driven amplifier sections comprise an input matching constant voltage bias circuit for carrying out input matching and for supplying a constant bias voltage to the amplifying elements, and an output matching power supply circuit for carrying out output matching and for supplying power to the amplifying elements; and
   said constant current driven amplifier sections comprise an input matching constant current bias circuit for carrying out input matching and for supplying a constant bias current to the amplifying elements, and an output matching power supply circuit for carrying out output matching and for supplying power to the amplifying elements.

5. The high frequency amplifier according to claim 2, further comprising an output matching power supply circuit for supplying power to said constant voltage driven amplifier sections and to said constant current driven amplifier sections, and for carrying out output matching of said constant voltage driven amplifier sections and of said constant current driven amplifier sections, wherein
   said constant voltage driven amplifier sections comprise an input matching constant voltage bias circuit for carrying out input matching and for supplying a constant bias voltage to the amplifying elements, and
   said constant current driven amplifier sections comprise an input matching constant current bias circuit for carrying out input matching and for supplying a constant bias current to the amplifying elements.

6. The high frequency amplifier according to claim 2, further comprising an input matching circuit for carrying out input matching of said constant voltage driven amplifier sections and said constant current driven amplifier sections; and
   an output matching power supply circuit for supplying power to said constant voltage driven amplifier sections and said constant current driven amplifier sections, and for carrying out output matching of said constant voltage driven amplifier sections and said constant current driven amplifier sections, wherein
   said constant voltage driven amplifier sections comprise a constant voltage bias circuit for supplying a constant bias voltage to the amplifying elements; and
   said constant current driven amplifier section comprise a constant current bias circuit for supplying a constant bias current to the amplifying elements.

7. The high frequency amplifier according to claim 2, wherein
   each of said constant voltage driven amplifier sections uses an FET as the amplifying element, and has a gate of the PET biased by a constant voltage; and
   each of said constant current driven amplifier sections uses a bipolar transistor as the amplifying element, and has a base of the bipolar transistor biased by the constant current.

* * * * *

UNITED STATES PATENT AND TRADEMARK OFFICE
CERTIFICATE OF CORRECTION

PATENT NO.         : 7,161,433 B2                                           Page 1 of 1
APPLICATION NO.    : 10/520077
DATED              : January 9, 2007
INVENTOR(S)        : Hiroomi Ueda et al.

It is certified that error appears in the above-identified patent and that said Letters Patent is hereby corrected as shown below:

Column 16, line 57, change "PET" to --FET--.

Signed and Sealed this

Eleventh Day of December, 2007

JON W. DUDAS
*Director of the United States Patent and Trademark Office*